United States Patent
Tseng et al.

(10) Patent No.: US 8,854,235 B1
(45) Date of Patent: Oct. 7, 2014

(54) DECOMPRESSION CIRCUIT AND ASSOCIATED COMPRESSION METHOD AND DECOMPRESSION METHOD

(71) Applicant: MStar Semiconductor, Inc., Hsinchu Hsien (TW)

(72) Inventors: Yu-Hsiang Tseng, Hsinchu Hsien (TW); Chih-Hao Chang, Hsinchu Hsien (TW); Cheng-Yu Hsieh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/018,539

(22) Filed: Sep. 5, 2013

(30) Foreign Application Priority Data

Apr. 2, 2013 (TW) .............................. 102111971 A

(51) Int. Cl.
*H03M 7/30* (2006.01)
*H03M 7/40* (2006.01)

(52) U.S. Cl.
CPC .......... *H03M 7/3088* (2013.01); *H03M 7/3086* (2013.01); *H03M 7/4006* (2013.01)
USPC ........................................... 341/51; 341/107

(58) Field of Classification Search
CPC ......................... H03M 7/3084–7/3088; H03M 7/4006–7/4018
USPC ............................................... 341/51, 87, 107
See application file for complete search history.

(56) References Cited

U.S. PATENT DOCUMENTS

| 5,627,534 | A * | 5/1997 | Craft ............................... 341/87 |
| 2007/0154106 | A1 * | 7/2007 | Koziarz ........................ 382/244 |
| 2009/0058693 | A1 * | 3/2009 | Laker et al. ..................... 341/65 |
| 2009/0112897 | A1 * | 4/2009 | Ordentlich et al. ........... 707/101 |
| 2009/0201180 | A1 * | 8/2009 | Schneider ........................ 341/51 |

OTHER PUBLICATIONS

Yehoshua Perl et al., The Cascading of the LZW Compression Algorithm With Arithmetic Coding, Data Compression Conference, 1991. DCC '91, IEEE, Apr. 1991, pp. 277-286.*

* cited by examiner

*Primary Examiner* — Howard Williams
(74) *Attorney, Agent, or Firm* — WPAT, PC; Justin King

(57) ABSTRACT

A decompression circuit for decompressing data includes a first decompression unit and a second decompression unit. The data sequentially includes a compressed first string, a compressed distance-length pair and a compressed second string. The first decompression unit performs a first decompression on the data to obtain a first string, a distance-length pair and a second string. The second decompression unit receives and decompresses the first string, the distance-length pair and the second string. The first decompression unit does not involve data associated with the distance-length pair when decompression the second string.

9 Claims, 3 Drawing Sheets

Performing first decompression data on data stream to obtain first decompressed data, wherein first decompressed data comprises plurality of literals and at least one distance-length pair, and data associated with distance-length pair is not required when decompressing next literal following distance-length pair — 300

Receiving first decompressed data, and performing second decompression operation on first decompressed data to obtain second decompressed data — 302

DECOMPRESSION CIRCUIT AND ASSOCIATED COMPRESSION METHOD AND DECOMPRESSION METHOD

This application claims the benefit of Taiwan application Serial No. 102111971, filed Apr. 2, 2013, the subject matter of which is incorporated herein by reference.

BACKGROUND OF THE INVENTION

1. Field of the Invention

The invention relates in general to a decompression circuit, and more particularly to a Lempel-Ziv-Markov chain-Algorithm (LZMA) decompression circuit and associated decompression method.

2. Description of the Related Art

In a compression operation using the Lempel-Ziv-Markov chain-Algorithm (LZMA), a repeating string is compressed into a distance-length pair. For example, a string "ABCDABCE" is compressed into "A, B, C D (4, 3), E", where (4, 3) is referred to as a distance-length pair that represents three literals (i.e., A, B, and C) (length) of four previous literals (distance). Another compression operation is then performed to generate compressed data. In a decompression process, the compressed data is decompressed, by binary arithmetic coding (BAC), into "A, B, C, D, (4, 3), E", which is then restored into "ABCDABCE" using an LZ77 decompression operation. When decompressing a next literal (commonly referred to as "delta literal", which is "E" in this example) of the length-distance pair using the BAC, a previous literal (the seventh literal "C" in this example) and the next literal (the fourth literal "D" in this example) of the string corresponding to the distance-length pair are used. Therefore, when decompressing "E" using the BAC, "C" and "D" can only be provided to a front-end for the BAC decompression after the distance-length pair (4, 3) is decompressed by the LZ77 operation, leading to reduced decompression efficiency. Further, compression/decompression utilizing the LZMA is all implemented through software.

SUMMARY OF THE INVENTION

The invention is directed to a decompression circuit and associated decompression and compression method for effective decompression that solves issues of the prior art.

According to an embodiment of the present invention, a compression method for compressing a string is provided. The compression method comprises generating a distance-length pair according to a plurality of literals in the string, and compressing a next literal following the literals. Data associated with the distance-length pair is not used when compressing the next literal.

According to another embodiment of the present invention, a decompression circuit for decompressing data is provided. The decompression circuit includes a first decompression unit and a second decompression unit. The data sequentially comprises a compressed first string, a compressed distance-length pair, and a compressed second string. The first decompressed performs a first decompression operation on the data to sequentially obtain a first string, a distance-length pair and a second string. The second decompression unit receives and decompresses the first string, the distance-length pair and the second string. The first decompression unit does not utilize data associated with the length-distance pair when decompressing the second string.

According to yet another embodiment of the present invention, a decompression method for decompressing data is provided. The data sequentially comprises a compressed first string, a compressed distance-length pair, and a compressed second string. The decompression method comprises: performing a first decompression operation on the data to sequentially obtain a first string, a distance-length pair, and a second string; and receiving and decompressing the first string, the distance-length pair, and the second string. The step of performing the first decompression operation on the data to sequentially obtain the first string, the distance-length pair and the second string comprises: not utilizing data associated with the distance-length pair when performing the first decompression data on the second string.

The above and other aspects of the invention will become better understood with regard to the following detailed description of the preferred but non-limiting embodiments. The following description is made with reference to the accompanying drawings.

DETAILED DESCRIPTION OF THE INVENTION

In a BAC compression technique, binary strings are compressed. During a BAC compression process, each bit is categorized by the BAC compression as a distance or a literal, or that the bit is a first bit of a literal.

Each category has an independent probability value, which is constantly updated in the compression process. When compressing the bit, the probability value corresponding to the bit is first referred, and the probability value is then updated according to whether a value of the bit is "0" or "1". In a conventional BAC compression process, when compressing a next literal of a distance-length pair, a literal associated with the distance-length pair is usually utilized. For example, to compress a string "ABCDABCE" into "A, B, C, D, (4, 3), E", the compression for "E" usually requires the use of data associated with the distance-length pair (4, 3). As such, a decompression process of "E" also requires the use of the literals "C" and "D" associated with the distance-length pair (4, 3), leading to reduced decompression efficiency.

Figure 1:
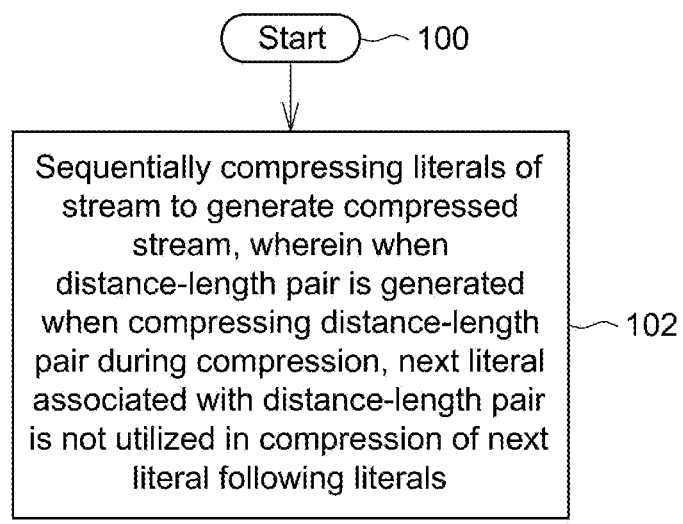
FIG. 1 is a flowchart of a compression method according to an embodiment of the present invention.

FIG. 1 shows a flowchart of a compression method according to an embodiment of the present invention.

The compression method beings in step 100.

In step 102, literals of a string are sequentially compressed to generate a compressed string. When a length-distance pair is generated during the compression process of the literals of the string, the compression process of a next literal following the literals does not require the use of the literals associated with the distance-length pair.

An example is described for illustrating the above compression process. Assuming that a string to be compressed is "ABCDABCE", the literals A, B, C, D, A, B and C are sequentially compressed into "ABCD(4, 3)", where (4, 3) indicates that, three literals starting from this position are identical to three literals (i.e., A, B, and C) starting from four previous literals. When compressing the next literal "E" following the distance-length pair (4, 3), the use of the literals associated with the length-distance pair (4, 3) is not required. In an embodiment, an approach for compressing "E" is the same as that for compressing the first literal "A".

Implementation details of the above compression method according to an embodiment of the present invention are as below.

offs=0x100;

symbol=0x100; (1).

do
{
matchByte<<=1;
EncodeBit(Prob+(offs+(matchByte & offs)+(symbol>>8)), (symbol>>7) & 1);
symbol<<=1;
offs &=~(matchByte^symbol);
}
while (symbol<0x10000);

prob=prob+(LZMA_LIT_SIZE*(((processedPos & lpMask))+

(dic[(dicPos==0?dicBufSize:dicPos)−1]>>8)));= prob+(LZMA_LIT_SIZE*(((processedPos & lpMask)) (2).

In equation (1) above, "offs" may have two values—"0x100" and "0", for representing whether a bit comparison value is correct or incorrect; "symbol" and "matchByte" are 8-bit values, respectively. Further, in equation (1), in the second line, a most significant bit (MSB) of "symbol" is set as "1"; in the sixth line, "EncodeBit(P, S) indicates an encoding result S, and P is utilized as an entry of the probability value; in the seventh to eight lines, "symbol" is shifted to the left by one bit, and compared for an MSB with "matchByte"; in the last line, it is stated that the steps are iterated until all the eight bits of "symbol" have been compared.

In equation (2), "LZMA_LIT_SIZE" is a fixed value (768 in this example), "processedPos" indicates the number of bits that have been written, and "lpMask" represents a basis for determining the number of bit values of "processedPos" to be utilized as an entry for the probability value. Further, in equation (2), the second line is originally intended to utilize "prob" added with "dic[ ]" as the entry of the probability value. However, since the description of "dic[ ]" in the equation (2) allows "prob", without adding "dic[ ]", to be directly utilized as the entry of the probability value, the compression method of the present invention is allowed not to involve data associated with the distance-length pair when compressing the next literal following the distance-length pair.

The above equations describe the concept of the core operation, and other details of the compression method are similar to those of the BAC compression technique. That is, the compression method of the present invention is performed on a binary string (i.e., the string is consisted of bit values "0" and "1"), and a probability table utilized is adaptively updated during the compression process of the string to accordingly compute and encode the bit values.

Therefore, in the compression method of the present invention, as the data associated with the distance-length pair is not involved when compressing the next literal following the distance-length pair, efficiency in a subsequent decompression process is enhanced. A decompression circuit and associated decompression method of the present invention are described below.

Figure 2:
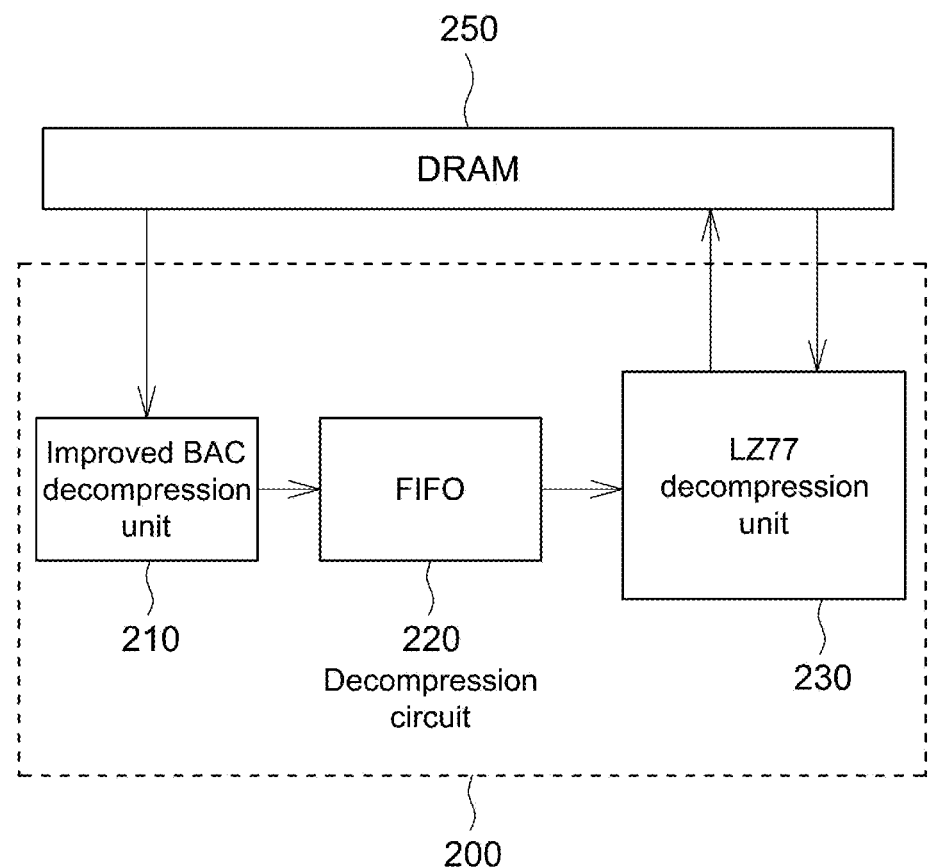
FIG. 2 is a schematic diagram of a decompression circuit according to an embodiment of the present invention.

FIG. 2 shows a schematic diagram of a decompression circuit 200 according to an embodiment of the present invention. As shown in FIG. 2, the decompression circuit 200, coupled to a dynamic random access memory (DRAM) 250, comprises a first decompression unit (in the embodiment, the first decompression unit is an improved BAC decompression unit 210), a first-in-first-out (FIFO) buffer 220, and a second decompression unit (in the embodiment, the second decompression unit is an LZ77 decompression unit 230). Further, in the embodiment, the decompression circuit 200 is an LZMA decompression circuit.

To perform a decompression operation by the decompression circuit 200, the improved BAC decompression 210 first receives a data stream from the DRAM 250, and decompresses the data stream to obtain first decompressed data. The first decompressed data comprises a plurality of literals and a distance-length pair. The first decompressed data is transmitted via the FIFO buffer 220 to the LZ77 decompression unit 230. The LZ77 decompression unit 230 decompresses the first decompressed data to obtain second decompressed data, and transmits the second decompressed data to another circuit. More specifically, in the embodiment, the data stream is the compressed data obtained from the compression method in FIG. 1, and so data associated with the distance-length pair is not involved when the improved BAC decompression unit 210 decompresses a next literal following the distance-length pair. Therefore, the improved BAC decompression unit 210 is capable of persistently decompressing data without waiting for the replied data from the LZ77 decompression unit 230, thereby enhancing decompression efficiency.

Further, a decompression concept of the improved BAC decompression unit 210 is similar to that of a BAC decompression operation. That is, each bit value of the data is compared with a reference value, and which probability table to be utilized for decompression is determined according to a comparison result. For example, when the first bit is the same as a reference value, values in the first probability table are utilized; when the first bit is different from the reference value, values in the second probability table are utilized.

More specifically, assuming that the improved BAC decompression unit 210 receives a data stream from the DRAM 250, wherein the data stream is the string "ABCD-ABCE" in a compressed form, the improved BAC decompression unit 210 first sequentially decompresses the data stream to obtain "A, B, C, D, (4, 3), E", where (4, 3) is a distance-length pair for representing three literals (i.e., ABC) of four previous literals. In the decompression process performed on the previous four literals "A, B, C, D", the decompression of the latter three literals requires data of a previous literal, respectively. That is to say, the decompression of "B" requires data of "A", and the decompression of "C" requires "B". Thus, the improved BAC decompression unit 210 is provided with a small buffer therein for temporarily storing data of a previous literal for the subsequent decompression. The improved BAC decompression unit 210 sequentially transmits the four sequentially decompressed literals "A, B, C, D", via the FIFO buffer 220, to the LZ77 decompression unit 230. The LZ77 decompression unit 230 directly transmits "A, B, C, D" to the DRAM 250 and/or another circuit that requires the data.

After decompressing the distance-length pair (4, 3), the improved BAC decompression unit 210 transmits the distance-length pair (4, 3), via the FIFO buffer 220, to the LZ77 decompression unit 230 for decompression, so as to obtain A, B, C represented by the distance-length pair (4, 3). Meanwhile, in the process that the improved BAC decompression unit 210 continues to decompress the data stream to obtain "E", the improved BAC decompression unit 210 is capable of directly decompressing the data stream without involving data associated with the distance-length pair (4, 3). That is, the improved BAC decompression unit 210 does not need to use the data replied from the LZ77 decompression data 230, or the LZ77 decompression unit 210 is not required to reply data associated with the length-distance pair (4, 3) to the BAC decompression unit 210. As illustrated, the improved BAC decompression unit 210 is capable of directly decompressing "E" without having to wait for other data, and so an overall decompression time can be shortened to enhance decompression efficiency.

In the embodiment in FIG. 2, the improved BAC decompression unit 210 and the LZ77 decompression unit 230 are taken as examples rather limitations of the present invention. The decompression circuit of the present invention is applicable to all decompression operations similar to decompression approaches based on BAC and LZ77.

Figure 3:
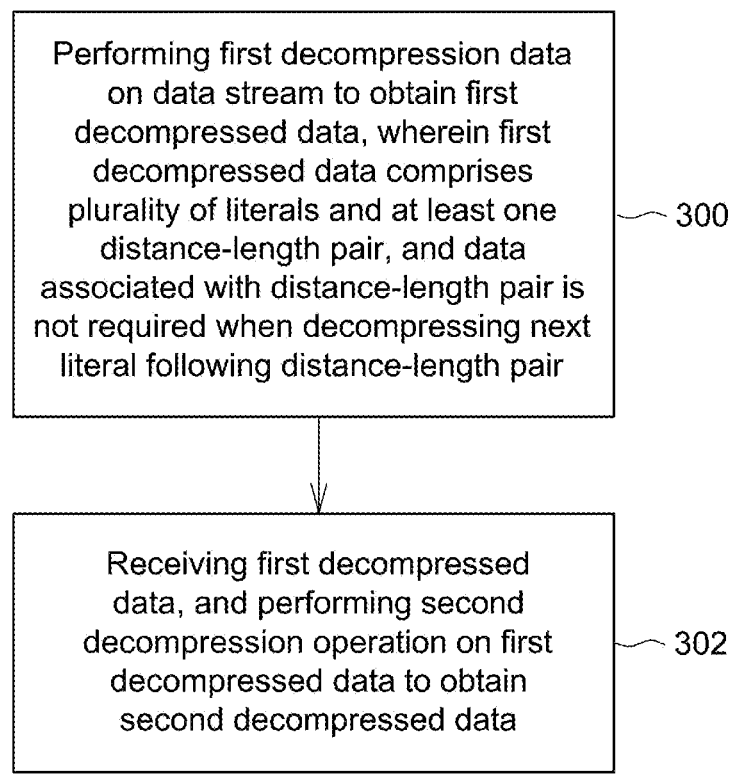
FIG. 3 is a flowchart of a decompression method according to an embodiment of the present invention.

FIG. 3 shows a flowchart of a decompression method according to an embodiment of the present invention. Referring to FIGS. 2 and 3 as well as operation details of the above decompression circuit 200, the decompression method comprises the following steps.

In step 300, a first decompression operation is performed on a first data stream to obtain first decompressed data. The first decompressed data comprises a plurality of literals and at least one distance-length pair. Data associated with the distance-length pair is not required when decompressing a next literal following the distance-length pair.

In step 302, the first decompressed data is received, and a second decompression operation is sequentially performed on the first decompressed data to obtain second decompressed data.

In conclusion, in the decompression circuit and associated decompression method of the present invention, when decompressing a next literal following a distance-length pair, the improved BAC decompression unit 210 is not required to use data associated with the distance-length pair. Therefore, the improved BAC decompression unit 210 is capable of continuously decompressing without waiting for data replied from the LZ77 decompression unit 230, thereby enhancing decompression efficiency.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A compression method, for compressing a string, comprising:
   generating a distance-length pair according to a plurality of literals of the string; and
   compressing a next literal following the literals;
   wherein, data associated with the distance-length pair is not utilized when compressing the next literal.

2. The compression method according to claim 1, wherein a compression approach of the next literal is same as a compression approach of a first literal of the string.

3. The compression method according to claim 1, wherein the string is a binary string, and a probability value is adaptively updated when compressing the string.

4. A decompression circuit, for decompressing data, the data sequentially comprising a compressed first string, a compressed distance-length pair, and a compressed second string; the decompression circuit comprising:
   a first decompression unit, for performing a first decompression operation on the data to sequentially obtain a first string, a distance-length pair, and a second string; and
   a second decompression unit, for receiving and decompressing the first string, the distance-length pair, and the second string;
   wherein, data associated with the distance-length pair is not utilized when the first decompression unit is performing the first decompression operation on the data to obtain the second string.

5. The decompression circuit according to claim 4, wherein the second decompression unit is an LZ77 decompression unit.

6. The decompression circuit according to claim 4, wherein the first decompression unit compares each bit value of the data with a reference value, and performs decompression according to a comparison result.

7. A decompression method, for decompressing data, the data sequentially comprising a compressed first string, a compressed distance-length pair, and a compressed second string; the decompression method comprising:
   performing a first decompression operation on the data to sequentially obtain a first string, a distance-length pair, and a second string; and
   receiving and decompressing the first string, the distance-length pair, and the second string;
   wherein, the step of performing the first decompression operation on the data to sequentially obtain the first string, the distance-length pair and the second string comprises:
      not utilizing data associated with the distance-length pair when performing the first decompression operation on the data to obtain the second string.

8. The decompression method according to claim 7, wherein the second decompression operation is an LZ77 decompression operation.

9. The decompression method according to claim 7, wherein the step of performing the first decompression operation on the data comprises:
   comparing each bit value of the data with a reference value, and performing decompression according to a comparison result.

* * * * *